(12) United States Patent  
Jarmany

(10) Patent No.: US 8,373,990 B2  
(45) Date of Patent: Feb. 12, 2013

(54) ELECTRONIC ASSEMBLY AND CASING THEREFOR

(75) Inventor: Nicholas Charles Leopold Jarmany, Chislehurst (GB)

(73) Assignee: Quixant Limited (GB)

( * ) Notice: Subject to any disclaimer, the term of this patent is extended or adjusted under 35 U.S.C. 154(b) by 83 days.

(21) Appl. No.: 12/967,188

(22) Filed: Dec. 14, 2010

(65) Prior Publication Data

US 2011/0310560 A1  Dec. 22, 2011

(30) Foreign Application Priority Data

Dec. 17, 2009 (GB) .................................. 0922077.3

(51) Int. Cl.  
*H05K 7/20* (2006.01)

(52) U.S. Cl. ........ 361/707; 361/719; 361/752; 361/760; 174/526; 174/535

(58) Field of Classification Search .................. 361/676, 361/677, 704–709, 715, 719, 720, 752, 760  
See application file for complete search history.

(56) References Cited

U.S. PATENT DOCUMENTS

| | | | | |
|---|---|---|---|---|
| 5,912,803 A * | 6/1999 | Dahl et al. | ..................... | 361/704 |
| 5,940,269 A * | 8/1999 | Ko et al. | ..................... | 361/697 |
| 6,049,469 A * | 4/2000 | Hood et al. | ..................... | 361/818 |
| 6,219,236 B1 * | 4/2001 | Hirano et al. | ................... | 361/695 |
| 6,365,964 B1 * | 4/2002 | Koors et al. | ..................... | 257/718 |
| 6,958,910 B2 * | 10/2005 | Tanaka et al. | ................. | 361/699 |
| 7,023,699 B2 * | 4/2006 | Glovatsky et al. | ............. | 361/704 |
| 7,031,165 B2 * | 4/2006 | Itabashi et al. | ................ | 361/719 |
| 7,132,746 B2 | 11/2006 | Brandenberg et al. | | |
| 7,443,686 B2 * | 10/2008 | Kuo et al. | ..................... | 361/719 |
| 7,679,917 B2 * | 3/2010 | Deck et al. | ..................... | 361/719 |
| 8,081,463 B2 * | 12/2011 | Chiu-Mao et al. | ............. | 361/702 |
| 2003/0198022 A1 * | 10/2003 | Ye et al. | .......................... | 361/719 |
| 2005/0201069 A1 | 9/2005 | Kirigaya | | |
| 2008/0037222 A1 | 2/2008 | Jha et al. | | |
| 2010/0263851 A1 | 10/2010 | Yasui | | |

FOREIGN PATENT DOCUMENTS

| | | |
|---|---|---|
| DE | 19624475 A1 | 1/1998 |
| EP | 1 508 915 A2 | 2/2005 |

* cited by examiner

*Primary Examiner* — Courtney Smith  
(74) *Attorney, Agent, or Firm* — Craig A. Fieschko, Esq.; DeWitt Ross & Stevens S.C.

(57) ABSTRACT

A secure control unit is provided with a completely sealed casing (22) of which at least one wall (24) forms a heat sink. The circuit board provided in the casing (22) is designed such that all of the heat generating components (16-20) which require cooling are located on the lower side of the circuit board (10) and in thermal connection with the heat sink wall (24). Components which do not generate excessive heat are located on the upper side of the circuit board (10). Raised conductive blocks (32-36) couple thermally the components (16-20) to the wall (24). With this arrangement it is not necessary to provide cooling internally of the casing (22) and it is possible nevertheless to use high powered components of the type which are found in modern computers. The casing remains secure and thus suitable for high security applications.

13 Claims, 4 Drawing Sheets

ELECTRONIC ASSEMBLY AND CASING THEREFOR

FIELD OF THE INVENTION

The present invention relates to an electronic assembly and to a casing therefor, in the preferred embodiment to an electronic assembly provided with a plurality of heat generating electronic components and to mechanisms for dissipating this heat from the assembly. The teachings herein are particularly suited to assemblies including computer systems for use in gaming and gambling machines—often referred to as "slot machines".

BACKGROUND OF THE INVENTION

In recent years there has been a trend in the slot machine industry to migrate from low performance, low power computer technologies to the PC standard architecture. This has greatly improved the performance of slot games but has introduced another problem. Computer architecture systems generally consume much more power and therefore generate more heat. Slot machines often have to operate reliably 24 hours a day, 365 days a year in locations that are hot and where ventilation is limited. This combination of factors presents difficulties in ensuring reliable, continuous operation which is a major consideration in the industry and a factor that affects the ability to sell into this tough environment.

It is also usually necessary for slot machines to comply with certain standards set by government, state or other regulatory bodies relating to the security of the slot machines, as they handle significant revenue streams. There are normally security requirements to ensure that the machines are not tampered with, either to manipulate payouts to users or the recording of transactions for the purpose of collecting government gaming taxes from machine operators. This is in addition to protection from physical attacks aimed at stealing money contained within the machines. Usually, this protection includes physical security to prevent unauthorized access to the interior of the slot machine and especially the "logic box" that houses the computer system and the operating programs.

The combination of high heat generation, strong physical access/tamper security, adverse environment and the requirement for high reliability presents a significant problem for the use of PC-based computer platforms in slot machines. Typically, PC based systems utilize fans mounted directly on hot components. The presence of fans, particularly of small size, impacts reliability severely. The position of the heat generating components within the systems usually means that the enclosing case cannot be sealed, as holes are required to ensure hot air is removed and an adequate supply of fresh cool air to maintain cooling efficiency. If apertures in the case are not present the fans simply act to circulate air within the box, resulting in an overall increase in temperatures, significantly impacting reliable operation. To summarize the specific issues that are presented by using high-performance PC systems in slot machines:

1) traditional PC systems utilize heat sinks and heat sink/fan assemblies on hot devices (such as CPUs) to remove heat from the devices into the surrounding air within the enclosure. This is an undesirable step, as ideally the heat should be removed directly to outside the enclosure. Also, fans are generally low reliability items, especially the small diameter fans generally directly mounted on devices in PC systems. For slot machines it is generally preferable to avoid fans entirely, or as a minimum use a large, slow, high reliability, long life fan;

2) traditionally, PC systems utilize apertures in the enclosure, often in conjunction with fans, to remove heat from inside the enclosure by drawing cool external air into the interior of the enclosure and exhausting hot air from inside the enclosure to the outside. This presents security issues in slot machines as holes in the logic box are either undesirable or not permitted by regulations. However, without these openings it is difficult to efficiently remove the heat generated within the logic box, resulting in undesirable elevated internal temperatures.

SUMMARY OF THE INVENTION

The present invention seeks to provide an improved logic box or other electronic assembly for use, for example, in a gaming device. The present invention also seeks to provide an improved casing for such a device.

According to an aspect of the present invention, there is provided an electronic assembly including a casing with walls providing an internal chamber, at least one circuit board located in the chamber and provided with a plurality of electronic components connected thereto, said electronic components including at least one heat generating component requiring cooling, wherein the circuit board is fitted to or proximate a said wall with the at least one heat generating component disposed on a side of the circuit board facing said wall and thermally coupled thereto, at least said wall being thermally conductive.

Advantageously, there is provided at least one coupling element for coupling the heat generating component or components to said wall. In the preferred embodiment, the coupling element or elements includes a conductive block between said wall and the or each component. The block or blocks could be a part of the wall or a separate component fixed to the wall. The or each coupling element could be of a metal such as aluminium or copper or a metal alloy.

In the preferred embodiment, there is provided one block per heat generating component of the circuit board.

It is envisaged that the heat generating components will all be located on what could be described as a wall facing surface of the casing while the other components of the circuit board, that is components which do not generate sufficient heat to require cooling, are located on a surface of the circuit board which faces into the chamber of the casing. This has an important advantage in avoiding the positioning of components in such a manner that heat is convected into the chamber of the assembly, which could call for the need for other cooling. Instead, the heat generating components are located to be in conductive heat contact with the wall or walls of the casing which provide for conductive heat transfer out of the casing and thus away from the chamber and other components located therein (it is not excluded that there could be a plurality of circuit boards which contact different walls of the casing).

It will be apparent that with the features taught herein it is not necessary to provide fan cooling of the electronic components of the assembly, thus avoiding the possible problems with such fans. Moreover, it is possible to have a casing which is completely closed or sealed, thus which is secure and meets regulations for safety and security.

Advantageously, said wall or walls against which the heat generating components are thermally coupled are provided with cooling fins on their surfaces outside of the chamber, that is of their external sides. The cooling fins will typically be of the type found with conventional component heat sinks.

There may be provided a fan for promoting air flow through the cooling fins. Such a fan can be of a relatively large design and thus reliable and does not require access to the interior of the casing, therefore does not compromise the integrity of the casing.

In the preferred embodiment, there is provided a heat transfer agent for maximising the coupling of the heat generating components to the coupling elements. The transfer agent may be a thermal grease, a thermal pad or any other known transfer agent.

Advantageously, there is provided at least one biasing element for biasing the heat generating component or components against the coupling element or elements. The or each biasing element is preferably of resilient form. In the preferred embodiment, there is provided at least one spring located to push the or each component against the coupling element. Most preferably, the or at least one of the biasing elements includes a sprung loaded screw, bolt pin or rivet. The element could be located on the circuit board.

In a practical embodiment, the or each biasing element is located proximate an associated heat conducting element, preferably on the circuit board. In the preferred embodiment, the or each biasing element is located no more than 15 mm from its associated component.

According to another aspect of the present invention, there is provided a circuit board for a control system; the circuit board including a front side and a rear side and holding a plurality of components including a set of first, heat generating, components which require cooling during operation; and a set of second components which generate insufficient heat to require cooling, wherein the first set of components are located on the rear side of the circuit board and at least some of the second set of components are located on the front side of the circuit board.

It is to be understood that the front side of the circuit board is the side intended to be accessible when the casing of an assembly is opened and the rear side of the circuit board is intended to refer to the side which is inaccessible when the casing is opened, that is the side closest to a wall of the casing.

Such an arrangement of components on the circuit board is contrary to established convention.

According to another aspect of the present invention, there is provided a casing for an electronic assembly, including walls providing an internal chamber, means for locating an electronic circuit board to or proximate a said wall with at least one heat generating component thereof disposed on a side of the circuit board facing said wall and to be coupled heat conductively thereto, and at least one raised coupling element on said wall for coupling the heat generating component or components to said wall.

Slot machines require a system design solution that provides efficient removal of heat from hot components contained within the logic box directly to the outside of the box, without using the air within the case to transport this heat. This should be accomplished without requiring any apertures in the enclosure, hence preserving the physical security of the system.

The solution taught herein can meet the needs of slot machines, combining both highly efficient and reliable cooling of high-power PC components while at the same time eliminating the need for ventilation holes in the Logic Box enclosure.

The preferred embodiments provide a solution that combines both the design of the printed circuit board coupled with matching mechanical and thermal design. Computer boards normally place major components such as the CPU, chipset and so on, on the top side of the printed circuit board (PCB). There are often components placed on the bottom side, but these are usually small components such as resistors, capacitors and small semiconductors, not the major chips.

By contrast, in the embodiments taught herein, the conventional arrangement is changed to re-locate the major heat generating chips (including the CPU, chipset and so on) to the bottom side of the PCB. The second step combines this modified PCB design approach with an enclosure design (or a portion of it) that acts directly as a heat dissipater or heat sink. The bottom side of the PCB is mounted directly onto this part of the enclosure with the hot components directly in contact (possibly via simple thermal blocks or spacers) with the case. This mechanical arrangement causes the heat generated by the major components to be directly conducted through the case wall to the outside surface without heating the air within the case. The material of the case (or this part of the case) is chosen to be an efficient thermal conductor, such as aluminium, and also to be an efficient radiator of heat, allowing the heat to be efficiently removed from the Logic Box to external air. This arrangement provides the following specific benefits:—

1) as heat is directly conducted away from hot components through to the outside of the casing, the temperature within the casing remains low, improving the thermal environment for all the components and hence enhances system reliability;
2) as the thermal path from the component surfaces to the outside of the casing is short and simple, the total thermal resistance is low meaning resulting in lower component temperatures for a given heat dissipation;
3) the assembly can have a casing which is completely sealed, with no requirement for any ventilation holes, providing excellent security;
4) the overall size of the package can be more compact as there is no need for a volume of air inside the casing for cooling air circulation.

DESCRIPTION OF THE DRAWINGS

Embodiments of the present invention are described below, by way of example only, with reference to the accompanying drawings, in which.

DESCRIPTION OF THE PREFERRED EMBODIMENTS

Various embodiments of the invention are described below, by way of example to illustrate the teachings herein. It is to be understood that the embodiments are illustrative only and that the skilled person will derive therefrom more general teachings as per the scope of the claims and summary of the invention section. It is also to be understood that the features of the different embodiments can be combined with one another within the principles taught herein.

Figure 1:
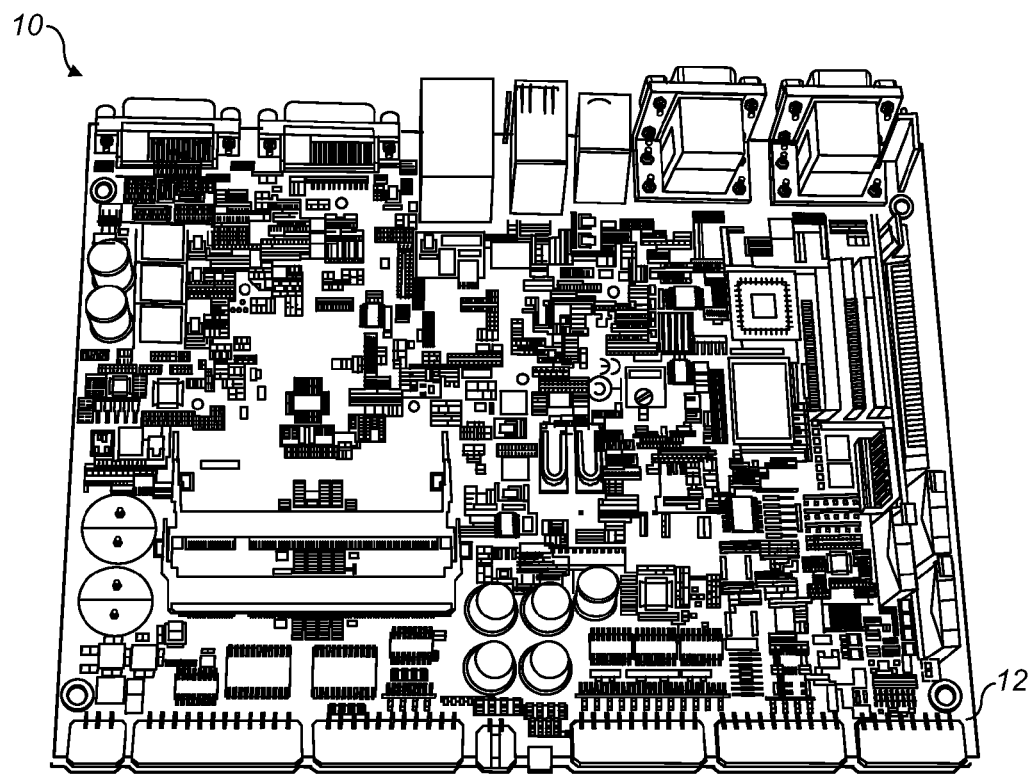
FIG. 1 shows a top view of an embodiment of printed circuit board assembly.
Figure 2:
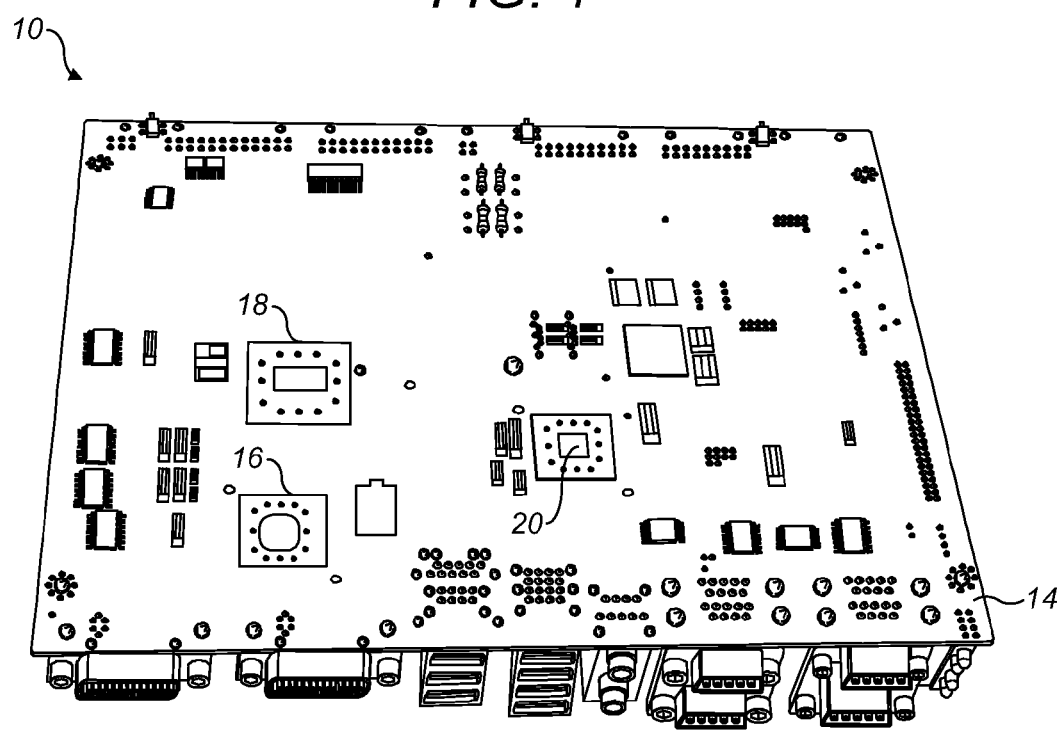
FIG. 2 shows a view of the bottom or reverse side of the printed circuit board assembly of FIG. 1.

Referring now to FIGS. 1 and 2, there is shown an embodiment of printed circuit board assembly 10 which is designed and arranged in accordance with the teachings herein. This example of printed circuit board assembly 10 is for a modern gaming machine and is provided with high power processing capabilities and includes a higher power microprocessor chip and other power components. In the embodiment shown in FIGS. 1 and 2, the majority of those components which do not in use generate substantial heat are located on an upper side 12 of the circuit board 10 and can be seen in the view of FIG. 1. The reverse or bottom side 14 of the printed circuit board 10 has located and fitted to its surface a plurality of high powered components 16-20, that is components which in use generate significant heat requiring cooling, along with other components. These components typically include a microprocessor chip, system chipset components, power regulator devices, amplifier chips and the like. Thus, the printed circuit board 10 is arranged such that those components which do not generate significant heat during use are all located on one side (side 12) of printed circuit board whereas those components which generate significant heat and which require cooling during use are located on the opposite (side 14) of the printed circuit board 10. Traditionally, components such as microprocessor chips and other such critical components of a printed circuit are located on the upper surface of the printed circuit board for easy access and for coupling to heat sinks and the like. The arrangement of printed circuit board 10 as shown in FIGS. 1 and 2 could therefore be described as being contrary to that conventionally found in such devices.

Figure 3:
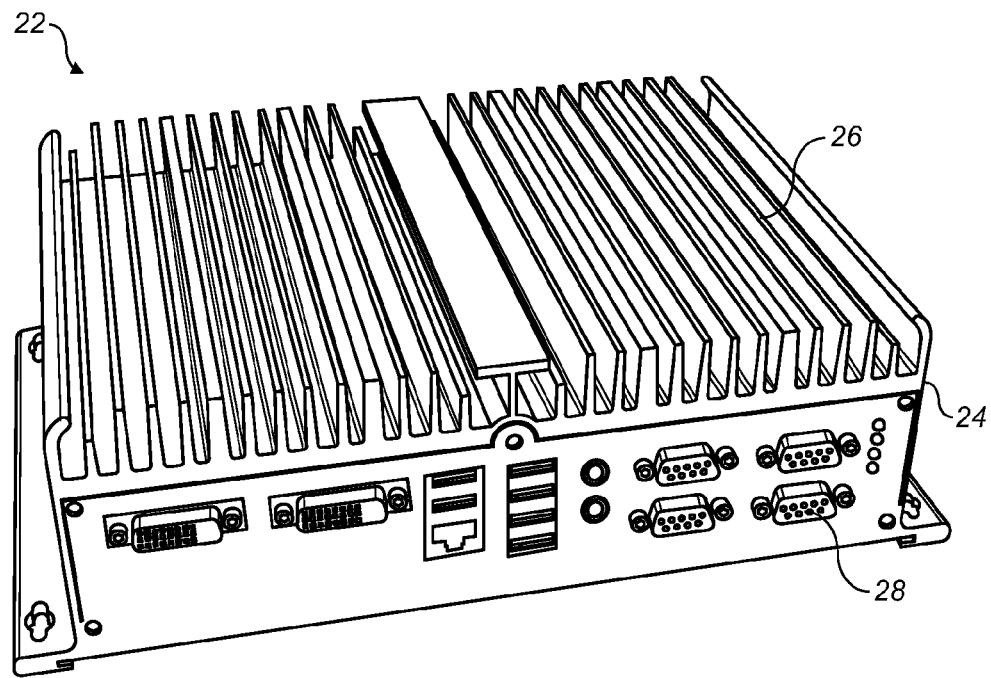
FIG. 3 is a perspective view of an embodiment of casing within which the printed circuit board assembly of FIGS. 1 and 2 is located.

Referring now to FIG. 3, there is shown an embodiment of casing 22 for housing the printed circuit board 10 shown in FIGS. 1 and 2. The casing 22 is, in this embodiment, of a type suitable for gaming and gambling machines and is made of a strong, sealed construction for security and regulatory purposes. Typically, the casing 22 is formed of a metal, such as aluminium, steel or any other suitable metal or metal alloy. In the preferred embodiment, the entirety of the casing 22 is made of metal or metal alloy, although it is envisaged that this could be made of other materials such as carbon fibre, plastics material and so on. At least the wall 24 of the casing 22 is made of a thermally conducted material.

As can be seen in FIG. 3, the wall 24 acts not only as a wall of the casing 22 but also as a heat sink, for which purpose the wall 24 is provided with an array of heat sink fins 26 of known characteristics.

The casing 22 is in the preferred embodiment completely sealed, that is entirely closed, and provides access only for a plurality of electrical connector elements 28 located in one wall of the casing 22.

Figure 4:
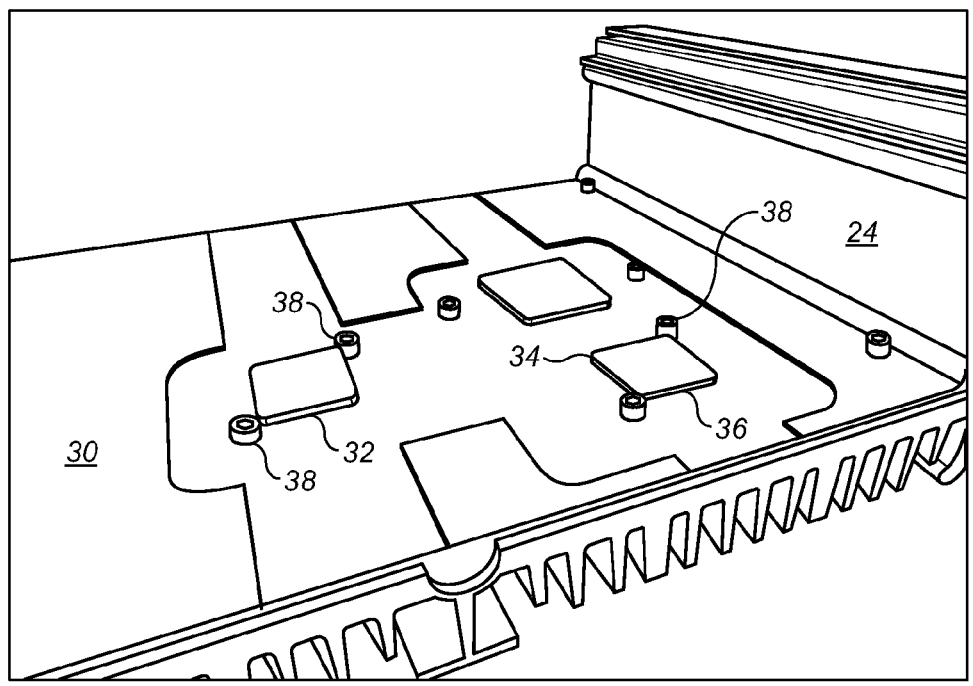
FIG. 4 is a view of one wall of the casing of FIG. 3 as seen from the inside.

Referring now to FIG. 4, there is shown the wall 24 of the casing 22, turned upside down with respect to the view of FIG. 3 so as to show the structure of the internal side 30 of the wall 24. As can be seen in FIG. 4, the internal side or surface 30 of the wall 24 is provided with a plurality of raised blocks 32, 34, 36 which in this embodiment are of substantially square shape and raised relative to the general extent or plane of the surface 30 of the wall 24. These blocks 32-36 are heat conductive blocks and may either be formed integrally with the wall 24, for instance by machining, casting or the like, or may be separate elements attached to the internal surface 30 of the wall 24. In this latter option, the blocks would be made of a heat conductive material, preferably a metal such as aluminium or copper and can be attached to the surface 30 of the wall 24 by any suitable bonding, welding or soldering technique.

Located approximate each block 32-36 are provided, in this embodiment, at least one and as shown two fixing posts 38 for the purposes described below. These fixing posts 38 are preferably spaced from the periphery of their associated block 32-36 by no more than around 10 to 15 mm and preferably no more than around 5 mm.

FIG. 4 shows three heat conductive blocks 32-36 and each of these is substantially square in shape. It is to be appreciated that the number of blocks 32-36, their location on the surface 30 of the wall 24 and their shape, height and size will be dependent upon the shape and size of their associated heat generating components with which they are to interact, that is the heat generating components located on the lower surface 14 of the printed circuit board 10 of any particular application.

Figure 5:
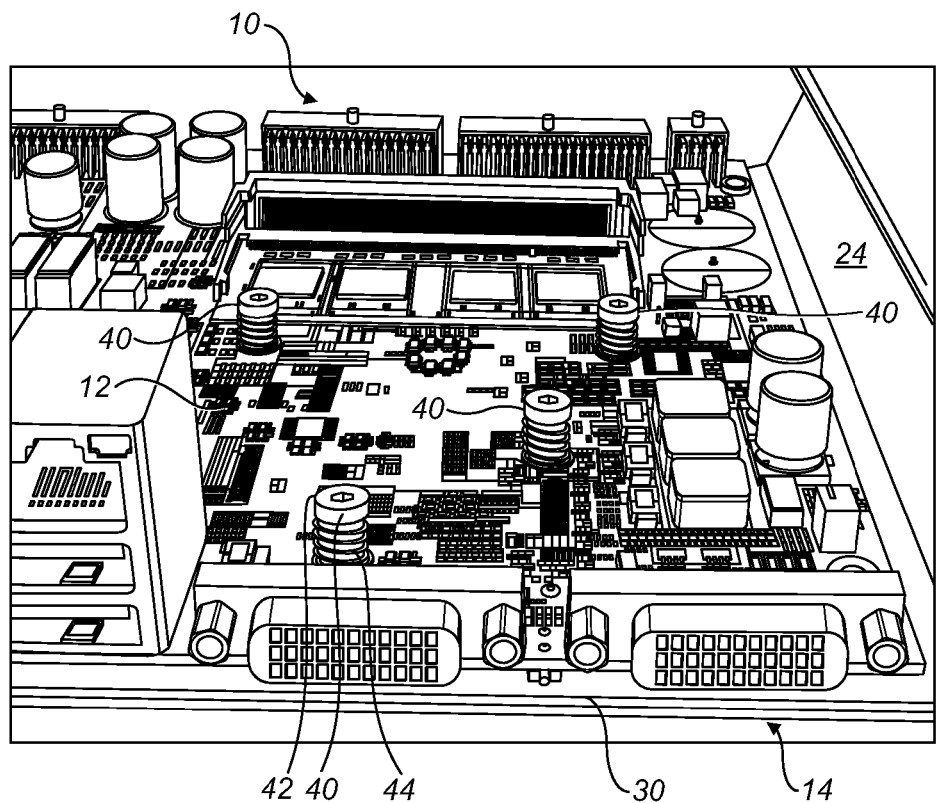
FIG. 5 is a view of the wall of the casing of FIG. 4 with the printed circuit board of FIGS. 1 and 2 connected thereto.

Referring now to FIG. 5, there is shown a view similar to that of FIG. 4, although in which the printed circuit board 10 is attached to the wall 24 of the casing 22. As can be seen, the printed circuit board 10 is disposed such that its lower surface 14 is adjacent and faces the surface 30 of the wall 24, whereas its upper 12 faces in the opposing direction and in practice into the general void within the casing 22. It will be appreciated, having regard to the teachings herein, that in this orientation the heat generating components provided on the printed circuit board 10 all face the surface 30 of the wall 24, whereas those components of the printed circuit board 10 which do not generate significant heat during operation of the circuit, face into the void of the casing 22.

Also shown in FIG. 5 are a plurality of sprung loaded connectors 40 which fix the printed circuit board 10 to the wall 24. These connectors 40 cooperate with respective posts 38 and in the preferred embodiment are in the form of a screw and nut arrangement, the screw being part of the connector 40 and the nut being part of the posts 38. It will be appreciated that the connectors 40 are arranged to align with their respective posts 38. Each connector 40 includes, in this embodiment, a screw element 42 and a coil spring 44 wrapped around the shank of the screw 42 and held in position by the enlarged head of the screw 42 such that the springs 44 press against the top surface 12 of the printed circuit board 10. The skilled person will appreciate that these connectors 40 pass through appropriately sized apertures within the printed circuit board, these apertures being sized to allow the shank of the screw to pass but are small enough to hold the other end of the coil springs 44. When the connectors 40 are fitted as shown in FIG. 5, they cause the coil springs 44 to become compressed such that these exert a constant biasing force to the printed circuit board 10 to press this against the wall 24 of the casing 22 and in particular to press the heat generating components 18-20 against their respective blocks 32-36 thereby to retain the components 16-20 in thermal contact with the blocks 32-36.

The springs 44 and the positioning of the elements 40 are preferably chosen to take into account the following considerations:—
1) they should apply sufficient force to ensure optimum thermal contact between the device to be cooled and the mating surface of the blocks 32-36 under all expected circumstances;
2) they should ensure the combination of the chosen force(s) together with the mechanical characteristics of the circuit board substrate material and proximity of other components does not create any risk of mechanical damage to any components;

3) they are preferably positioned as close as practicable to the component mechanical contact area so as to localize the force as far as possible only to the component(s) to be cooled. In general this will be within around 15 mm of the periphery of the individual device, preferably within 5 mm based on a standard 1.6 mm printed circuit board substrate made of FR4 material;

4) the force they generate should preferably not exceed the maximum specified by the individual component vendor(s) as being acceptable to the device(s), taking into account any potential for mechanical shock impacts to the overall system during use or transportation.

In the preferred embodiment, there is provided between each blocks 32-36 and its respective components 16-20 a thermal coupling element which may be a thermal grease or a thermal pad. Thermal grease and thermal pads are well known in the art for providing good thermal coupling between an electronic component and an associated heat sink. Thermal pads are typically made of a phase-change material which is able readily to conform to the surfaces of the electronic component and with the heat sink, in this case the surfaces of the component 16-20 and the surfaces of the blocks 32-36. Since thermal grease and thermal pads are well known in the art, it is not necessary to describe these in detail herein.

The sprung loaded connectors 40 also have the function of compressing the thermal interface material (the thermal grease of pads) to enhance the thermal coupling between the circuit components 16-20 and their respective coupling blocks 32-36.

Figure 6:
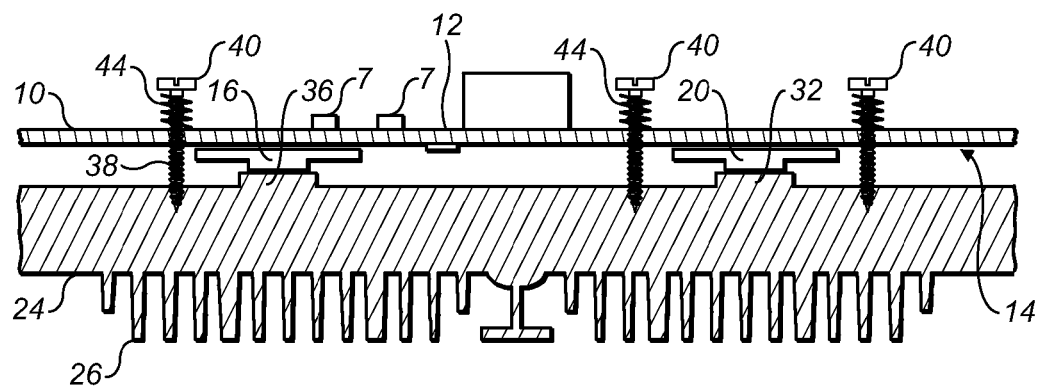
FIG. 6 is a schematic diagram of the printed circuit board as it is connected to the wall of the casing as shown in FIG. 4.

The arrangement of the printed circuit board 10 on the wall 24 of the casing 22 can be seen better in the diagram of FIG. 6, which shows a side elevational view of the principal components of the printed circuit board 10 and wall 24. As can be seen, the circuit components or chips 16, 20 (the chip 18 not being visible in the view of FIG. 6) abut and are in thermal contact with their respective raised blocks 36, 32 and preferably in contact therewith by means of a thermal grease or thermal pad located between the chips and conductive blocks. The connecting members 38, 40 hold the printed circuit board 10 against the wall 24 and the components 16-20 against their raised blocks 32-36 to maintain thermal contact between them. Any movement of the casing 22 which could cause uncoupling, thermally, of the components 16-20 from their respective conductive blocks 32-36 is negated or otherwise substantially reduced as a result of the sprung connectors 40, the springs 44 of which will maintain a constant bias pressure of the printed circuit board 10 to the wall 24 and in particular of the components 16-20 against their respective raised blocks 32-36.

It should also be appreciated, in particular from FIG. 6, that the heat generating components 16-20 of the printed circuit board assembly 10 are all located on a side of the printed circuit board 10 which faces the thermally conductive wall 24, that is the heat sink. The components on the upper surface 12 of the printed circuit board 10 face and extend into the main void in the casing 22 but these do not generate significant heat during operation of the assembly and therefore do not cause heating within the casing 22 which would warrant or necessitate cooling of the air within the casing 22, which would typically have to be achieved by fans or other specific cooling arrangement. This is avoided by ensuring that the high heat generating components are coupled thermally to the wall 24 and thus to the external heat sink which this provides. The material of the printed circuit board 10 can act as a thermal insulator, thus insulating the general void within the casing 22 from heat generated by the components 16-20.

This arrangement has the advantage of maintaining the temperature within the void of the casing 22 at an acceptable level and of ensuring that heat generated by the components 16-20 is directed specifically to the heat sink of the wall 24.

It should also be appreciated, in particular from the view of FIG. 6, that each of the raised conductive blocks 32-36 is shaped and sized for a particular component to which it is associated and in this regard the blocks 32-36 could also be of varying heights in dependence upon the depth of to which its associated component extends below the surface of the printed circuit board 10 and thus the distance between the surface of that component and the plane 30 of the wall 24. The provision of thermal grease or thermal pads will smooth out any imperfections in the facing surfaces of the component and device, thus maximising thermal contact between these two elements. Of course, it is possible to provide elements with no surface imperfections and thus to avoid using thermal grease or thermal pads. However, this is difficult to achieve in practice, in particular as a result of manufacturing tolerances and so on.

It is to be appreciated that the casing 22 can avoid the need for any thermal cooling within the void of the casing 22 in light of the fact that the arrangement avoids transfer of heat into that void. As a result, the casing 22 can be made smaller than prior art casings which require the provision of air flow within the void of the casing for cooling purposes. The arrangement taught herein results in a more compact and more secure casing 22 and control assembly.

Figure 7:
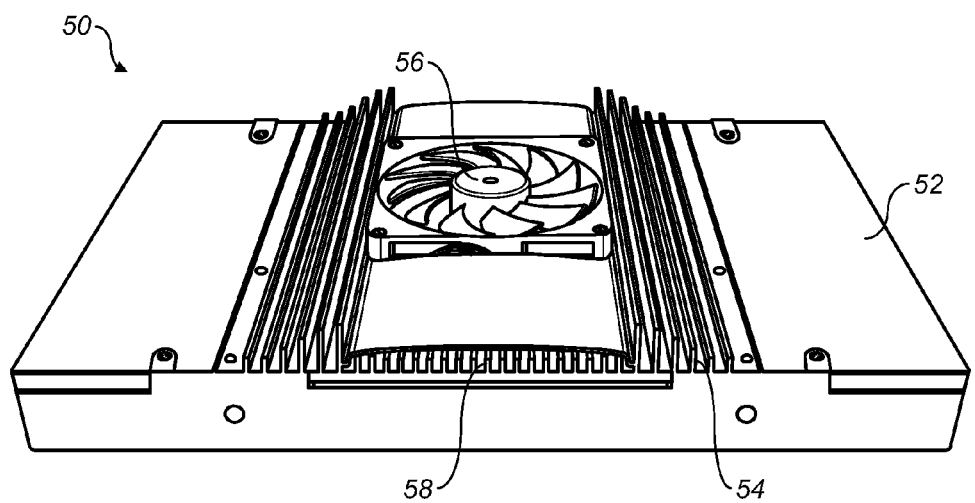
FIG. 7 is a perspective view of another embodiment of casing.
Figure 8:
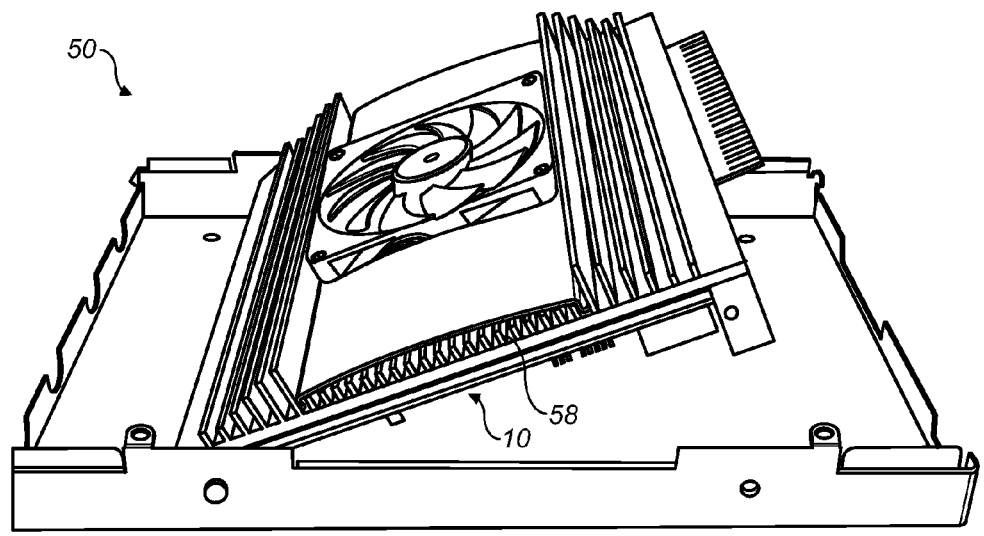
FIG. 8 is a view of the casing of FIG. 7 in a partially opened configuration.

Referring now to FIGS. 7 and 8, there is shown another embodiment of casing 50. This casing has generally the same characteristics as the casing 22 and is able to accommodate a printed circuit board such as that shown in FIGS. 1 and 2. The casing 50 in the embodiment shown in FIGS. 7 and 8 includes only a portion of the upper wall 52 thereof which acts as a heat sink 54 and thus the upper wall 52 is only partially provided with heat sink fins. This is a particular design preference for the embodiment shown in FIGS. 7 and 8 and there is also provided access to the printed circuit board 10 by pivoting of the heat sink portion 54 of the casing 50. It will be appreciated that the casing 50 could have another design and indeed could have a design similar to that of the embodiment of FIGS. 3 to 5.

In the embodiment of casing 50 shown in FIGS. 7 and 8, there is provided at the fins of the heat sink portion 54 a fan arrangement 56. It is to be understood that this fan arrangement 56 does not act on the interior of the casing 50, that is that the casing 50 is not provided with any aperture into it through the fan 56. The casing 50 remains fully sealed and the fan acts only upon, in this example, the central fins 58 of the heat sink portion 54 of the casing 50. In other words, the fan 56 in this example sits on top of and is coupled to the central fins 58. The fan 56 has the purpose of generating air flow within the fins 58 in order to maximize the cooling effect provided by the fins 58 and thus by the heat sink portion 54 of the casing 50. This fan, mounted to the external surface of the casing 50, reduces the surface area of the heat sink required as well as the mass of the heat sink. The slim profile of the design, as can be seen in FIGS. 6 and 7, is achievable by not having to have any air circulation or heat dissipating components within the casing 50.

The fan 56 can be a large diameter fan having a slow rotation speed, which can prolong its reliability and operating life. It should be appreciated also that operation of the fan 56 is not necessarily essential to the functioning of the control unit of which the casing 50 forms a part and also that the fan 56 could be replaced if necessary without any need to gain access to the housed components within the casing 50 and thus without any need to compromise the security of those components.

In the embodiment shown in FIGS. 7 and 8 there are located either side of the fan, in the direction of the fins, first and second plates 58 which lie on top of the fins and act to duct the air flow generated by the fan, thereby to keep this within the fins to assist in heat transfer.

It should be appreciated from the above that the arrangement of electrical components on the printed circuit board and the arrangement of the printed circuit board within the casing, as well as the design features of the casing, can meet the requirements of the slot machine industry described above and also other industries which require secure electronic control units. The embodiments described above enable high performance systems to be designed and manufactured based on components which dissipate large amounts of heat during their operation, whilst providing highly efficient cooling which ensures reliability of the equipment while at the same time eliminating ventilation holes which can create security issues. The arrangement can be implemented in a relatively low cost unit and without any major changes in existing design and production technology.

Preferred versions of the invention have been described above in order to illustrate how to make and use the invention. The invention is not intended to be limited to these preferred versions, but rather is intended to be limited only by the claims set out below. Thus, the invention encompasses all different versions that fall literally or equivalently within the scope of these claims.

The invention claimed is:

1. An electronic assembly including a casing with walls providing an internal chamber, at least one circuit board located in the chamber and provided with a plurality of electronic components connected thereto, the circuit board including:
   a. a front side facing the internal chamber,
   b. a rear side facing a bottom thermally conductive wall of the casing,
   c. a first set of heat generating components which require cooling during operation, the first set being located on the rear side of the circuit board, and
   d. a second set of components which generate insufficient heat to require cooling, at least some of the second set of components being located on the front side of the circuit board,
   wherein there is provided at least one resilient biasing element for biasing each of the heat generating components of the first set against the bottom wall of the casing, each biasing element connecting the circuit board to the bottom wall.

2. An assembly according to claim 1, wherein there is provided at least one coupling element for coupling the heat generating component or components to said wall.

3. An assembly according to claim 2, wherein the coupling element or elements include a conductive block between said wall and the or each component, and wherein the block or each block is a part of the wall or a separate component fixed to the wall.

4. An assembly according to claim 2, wherein the or each coupling element is made of a metal or metal alloy, and/or wherein there is provided one coupling element per heat generating component of the circuit board.

5. An assembly according to claim 2, wherein there is provided a heat transfer agent between the or each heat generating component and its respective coupling element.

6. An assembly according to claim 5, wherein the transfer agent includes a thermal grease or a thermal pad.

7. An assembly according to claim 1, wherein the casing is substantially completely or completely closed or sealed.

8. An assembly according to claim 1, wherein said wall to which the heat generating components are thermally coupled are provided with cooling fins on external sides thereof.

9. An assembly according to claim 8, including a fan for promoting air flow through the cooling fins.

10. An assembly according to claim 1, wherein there is provided at least one spring located to push the or each component against said wall or associated the coupling element.

11. An assembly according to claim 10, wherein the or at least one of the biasing elements includes a sprung loaded screw, bolt pin or rivet.

12. An assembly according to claim 1, wherein the or each biasing element is located proximate an associated heat conducting element.

13. An assembly according to claim 12, wherein the or each biasing element is located no more than around 15 mm from its associated component.

* * * * *